(12) United States Patent
Kern

(10) Patent No.: US 7,408,409 B2
(45) Date of Patent: Aug. 5, 2008

(54) AMPLIFIER CIRCUIT WITH CROSS-COUPLED CASCODE TRANSISTORS

(75) Inventor: Alexandra Kern, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 11/477,097

(22) Filed: Jun. 27, 2006

(65) Prior Publication Data

US 2007/0296497 A1 Dec. 27, 2007

(51) Int. Cl.
*H03F 3/45* (2006.01)
(52) U.S. Cl. ...................................... 330/253
(58) Field of Classification Search ........................ None
See application file for complete search history.

(56) References Cited

U.S. PATENT DOCUMENTS

| | | | | |
|---|---|---|---|---|
| 5,264,805 A | * | 11/1993 | Yokozaki | 330/107 |
| 5,272,395 A | * | 12/1993 | Vincelette | 327/63 |
| 5,345,346 A | * | 9/1994 | Brannon et al. | 360/67 |
| 5,493,254 A | | 2/1996 | Fairgrieve | |
| 5,532,644 A | * | 7/1996 | Nakagawara | 330/254 |
| 5,912,587 A | * | 6/1999 | Mihailovits et al. | 330/252 |
| 6,713,749 B2 | * | 3/2004 | Wu et al. | 250/214 A |
| 6,720,826 B2 | * | 4/2004 | Yoon | 330/69 |
| 6,784,734 B2 | * | 8/2004 | Amourah | 330/253 |
| 6,980,050 B2 | | 12/2005 | Liu | |

FOREIGN PATENT DOCUMENTS

JP 16-55099 A 2/2004

* cited by examiner

*Primary Examiner*—Robert J. Pascal
*Assistant Examiner*—Alan Wong
(74) *Attorney, Agent, or Firm*—Schwabe, Williamson & Wyatt, P.C.

(57) ABSTRACT

Embodiments of the present invention provide differential pair amplifier circuits including cross-coupled cascode transistors. Other embodiments may be described and claimed.

22 Claims, 3 Drawing Sheets

AMPLIFIER CIRCUIT WITH CROSS-COUPLED CASCODE TRANSISTORS

TECHNICAL FIELD

Embodiments of the present invention relate to the field of circuits, and more particularly, to differential pair amplifiers including cross-coupled n-type metal oxide semiconductor cascode transistors.

BACKGROUND

High performance trans impedance amplifier (TIA) circuits are important building blocks for high speed data communication, such as optical chip-to-chip links at data rates beyond 20 gigabits per second (Gb/s). In order to achieve the best possible gain/bandwidth performance in complementary metal oxide semiconductor (CMOS) receivers for chip-to-chip optical interconnects, inductive peaking is generally used to extend the bandwidth and resonate out parasitic capacitance. Additional gain is often obtained by introducing larger input devices or larger resistive loads, which may reduce bandwidth. Alternatively, additional gain stages may be introduced, which consume additional power. Furthermore, as CMOS scales further into the nanometer gate length range, the transconductance and drain resistance may be reduced, which may lead to a decrease in gain.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide differential pair amplifier circuits including cross-coupled cascode transistors.

Figure 1:
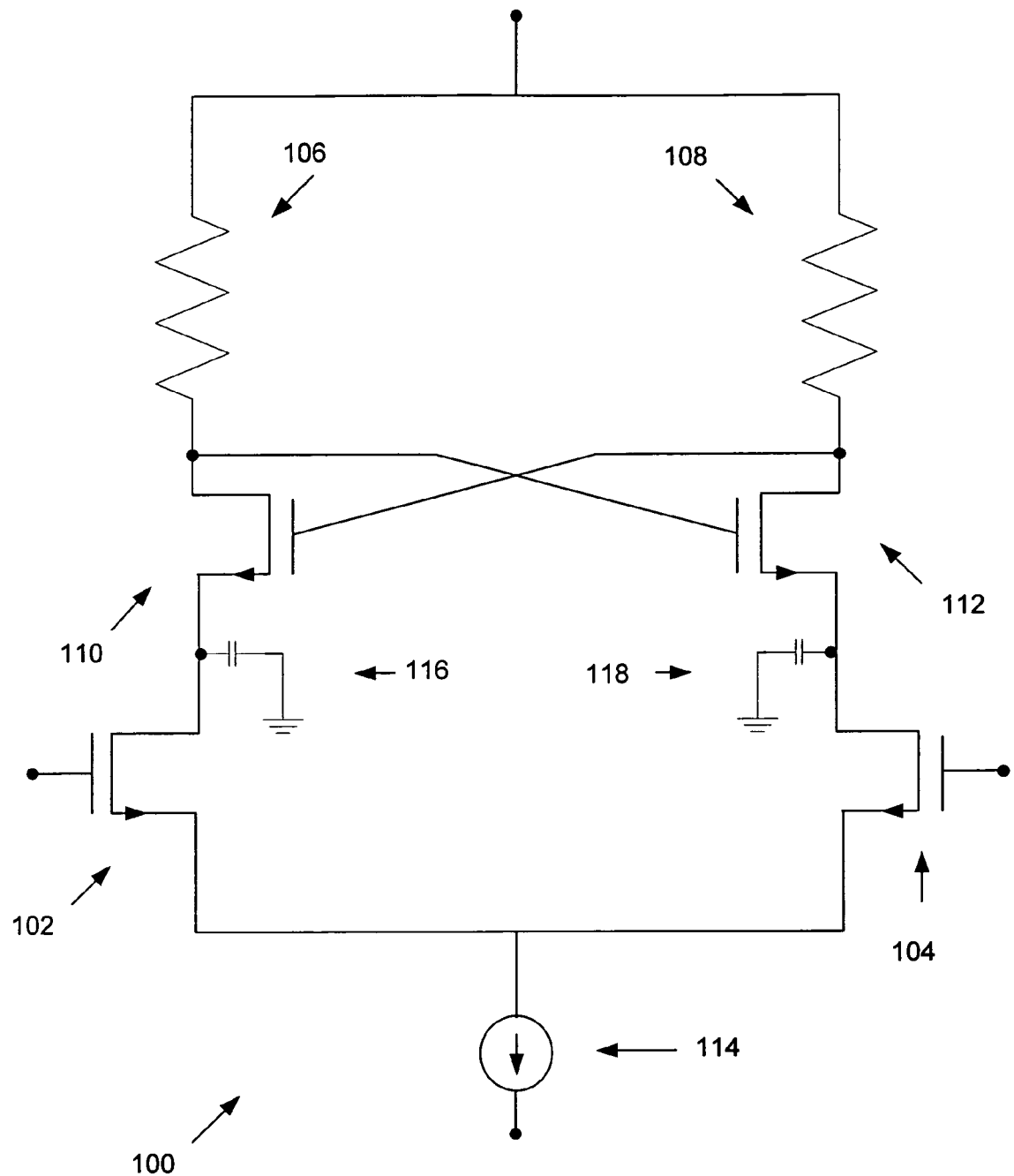
FIG. 1 is a schematic diagram of a voltage amplifier circuit in accordance with various embodiments of the present invention.

Referring to FIG. 1, an amplifier circuit 100 in accordance with various embodiments of the present invention is illustrated. The amplifier circuit 100 includes two differential pair transistors 102, 104 arranged as a differential pair. Resistive loads for the transistors are represented by 106, 108. Two cascode transistors 110, 112 are cross-coupled between the output of the differential pair and the resistive loads as cascode devices. Thus, transistors 102, 104, 110 and 112 form two cascodes. Accordingly, the drain of transistor 110 is operatively coupled to resistive load 106 and the gate of transistor 112, the source of transistor 110 is operatively coupled to the drain of transistor 102, and the gate of transistor 110 is operatively coupled to the drain of transistor 112 and resistive load 108. The drain of transistor 112 is operatively coupled to resistive load 108 and the gate of transistor 110, the source of transistor 112 is operatively coupled to the drain of transistor 104, and the gate of transistor 112 is coupled to the drain of transistor 110 and resistive load 106. Current within amplifier circuit 100 is modeled by current source 114. Such an arrangement may be used as a stand-alone voltage amplifier.

In accordance with various embodiments of the present invention, additional capacitance 116, 118 may be provided at the nodes shared by the drains of the differential pair transistors 102, 104 and the sources of the cascode transistors 110, 112 in order to increase the gain peaking of the amplifier circuit. This may be especially useful if load capacitance is large.

Figure 2:
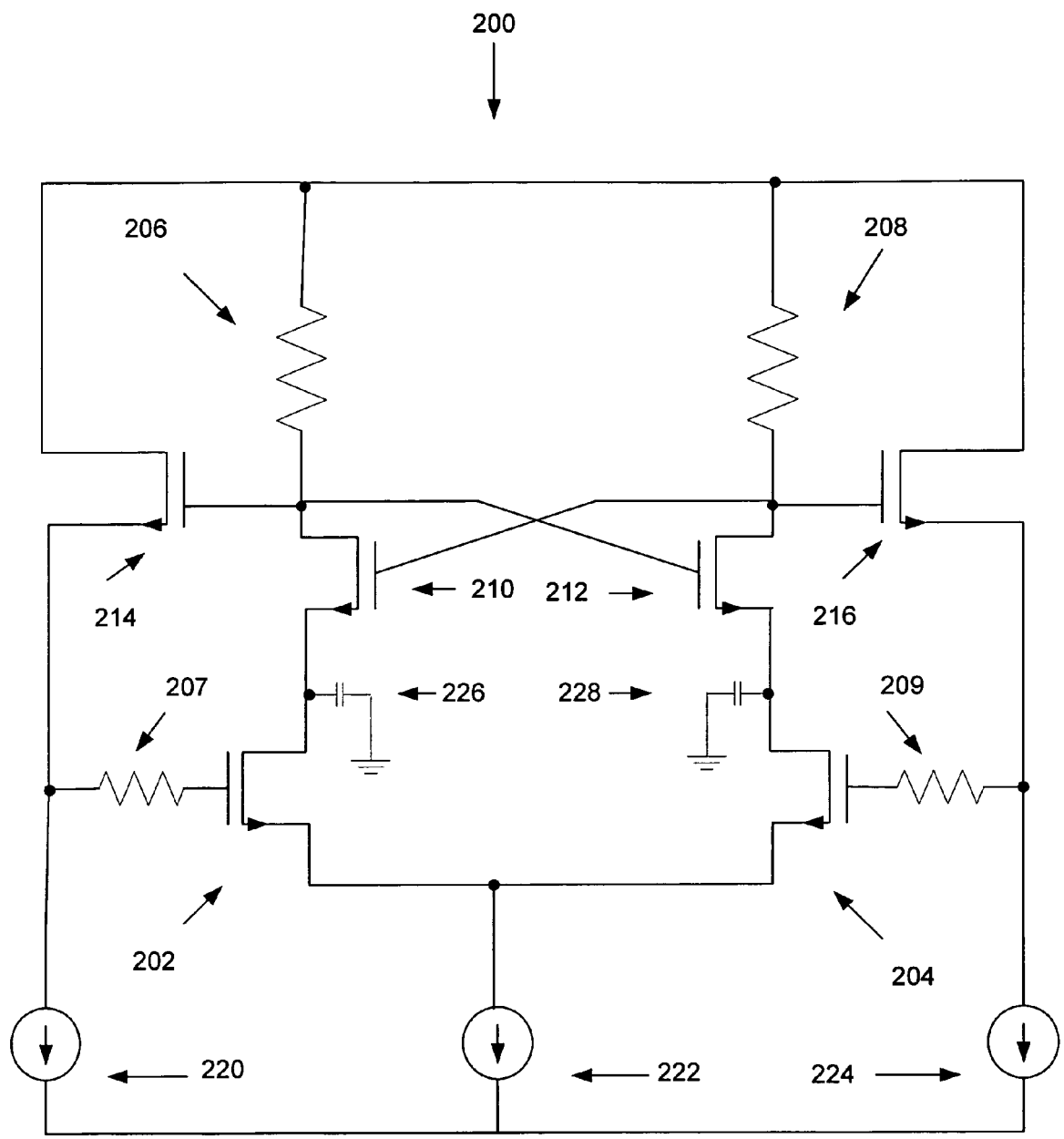
FIG. 2 is a schematic diagram of a TIA amplifier circuit in accordance with various embodiments of the present invention.

Referring to FIG. 2, an amplifier circuit 200 arranged as a trans-impedance amplifier (TIA) in accordance with various embodiments of the present invention is illustrated. The amplifier circuit 200 includes two differential pair transistors 202, 204 arranged as a differential pair. Resistive loads for the transistors are represented by 206, 208. The differential pair is configured with two source follower transistors 214, 216 arranged in feedback. Two feedback resistors 207, 209 are provided at the source follower output and differential pair input. While the embodiment illustrated in FIG. 2 is illustrated as a symmetric embodiment, those skilled in the art will understand that the input to the TIA may be single-ended and thus, the biasing of the node that is not driven in such an embodiment may be biased in a variety of ways known in the art.

Two cascode transistors 210, 212 are cross-coupled between the output of the differential pair and the resistive loads as cascode devices. Thus, transistors 202, 204, 210 and 212 form two cascodes. Accordingly, transistor 210 has its source operatively coupled to the drain of transistor 202 within the differential pair, while the drain of transistor 210 is operatively coupled to resistive load 206, the gate of source follower transistor 214 and the gate of transistor 212. The gate of transistor 210 is operatively coupled to the gate of source follower transistor 216, the drain of transistor 212 and resistive load 208. The source of transistor 212 is operatively coupled to the drain of transistor 204 of the differential pair, while the drain of transistor 212 is operatively coupled to resistive load 208, the gate of source follower transistor 216 and the gate of transistor 210. The gate of transistor 212 is operatively coupled to the gate of source follower transistor 214, the drain of transistor 210 and resistive load 206. Current within TIA 200 is modeled by current sources 220, 222, 224.

In accordance with various embodiments of the present invention, the amplifiers of FIGS. 1 and 2 are complementary metal oxide semiconductor (CMOS) amplifiers and transistors 110, 112, 210 and 212 are n-type metal oxide semiconductor (NMOS) transistors.

In accordance with various embodiments of the present invention, additional capacitance 226, 228 may be provided at the nodes shared by the drains of the input differential pair transistors 202, 204 and the sources of the cascode transistors 210, 212 in order to increase the gain peaking of the amplifier circuit. This may be especially useful if load capacitance is large.

Those skilled in the art will understand that one each or multiple ones of the circuits of FIGS. 1 and 2 may be selectively expanded and/or coupled together to provide increased amplification.

The present invention thus provides an amplifier circuit that provides improved gain/bandwidth performance, especially in CMOS receivers for chip-to-chip optical interconnects without using inductors. This may result in savings of die area.

Figure 3:
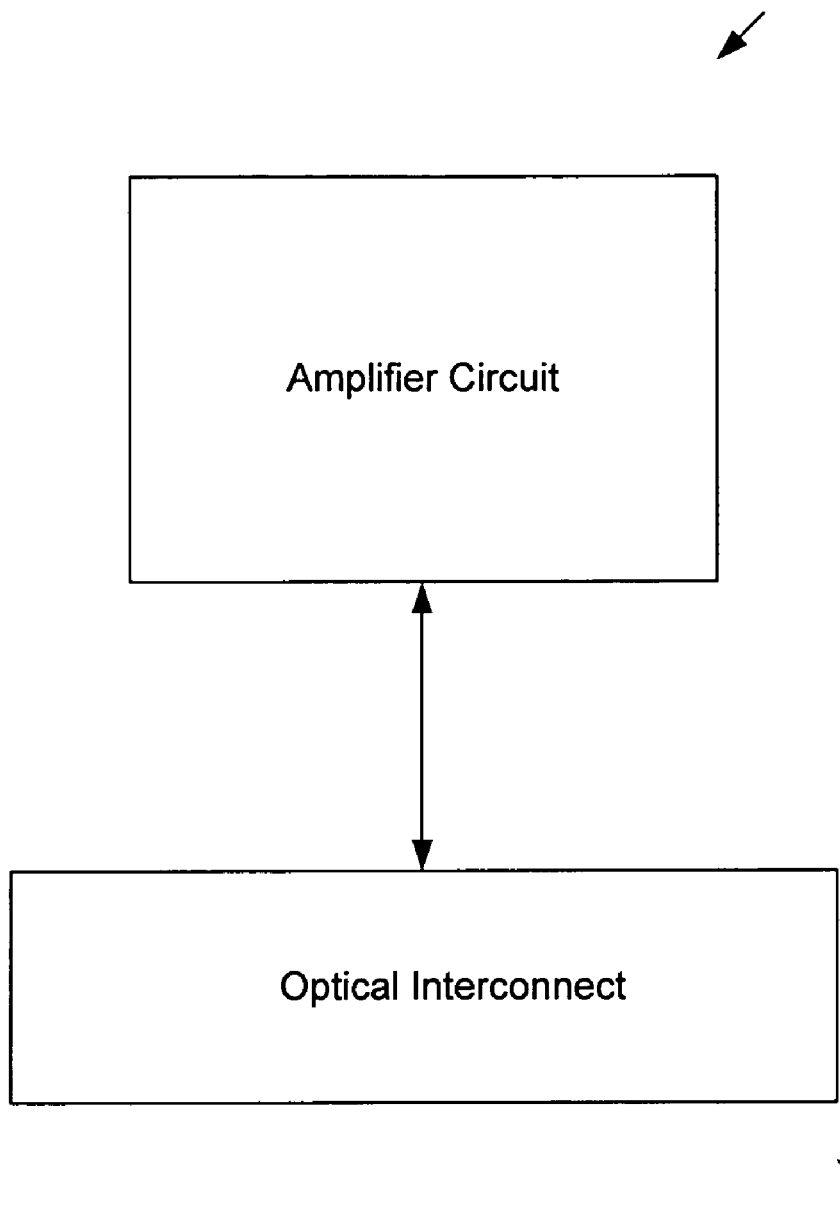
FIG. 3 is a schematic diagram of an amplifier circuit in accordance with various embodiments of the present invention operatively coupled to an optical interconnect.

FIG. 3 schematically illustrates an amplifier circuit arrangement 300 in accordance with various embodiments of the present invention operatively coupled to one or more optical interconnects 302 as an example. Amplifier circuit arrangement 300 may comprise one or more of amplifier circuits 100 and/or 200 described earlier. The optical interconnects may provide chip to chip links for high speed data communication.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An amplifier circuit comprising:
   a first differential pair transistor and a first cascode transistor arranged as a first cascode;
   a second differential pair transistor and a second cascode transistor arranged as a second cascode; and
   a first source follower transistor operatively coupled to the first cascode and a second source follower transistor operatively coupled to the second;
   wherein the first and second cascodes are arranged as a differential pair; and
   wherein the first cascode transistor is cross-coupled to the second cascode transistor.

2. The amplifier circuit of claim 1, wherein the amplifier circuit is a complementary metal oxide semiconductor (CMOS) amplifier circuit.

3. The amplifier circuit of claim 1, wherein the cascode transistors are n-type metal oxide semiconductor (NMOS) transistors.

4. The amplifier circuit of claim 1, wherein the amplifier circuit is configured as a trans-impedance amplifier (TIA).

5. The amplifier circuit of claim 4, further comprising additional capacitance operatively coupled to nodes shared by drains of the differential pair transistors and sources of the cascode transistors.

6. The amplifier circuit of claim 1, further comprising additional capacitance operatively coupled to nodes shared by drains of the differential pair transistors sources of the cascode transistors.

7. The amplifier circuit of claim 1, wherein the amplifier circuit is configured as a stand-alone voltage amplifier.

8. A method comprising:
   arranging a pair of transistors as a first cascode;
   arranging a pair of transistors as a second cascode;
   arranging the first and second cascodes as a differential pair;
   cross-coupling one transistor of the first cascode to one of the transistor of the second cascode; and
   operatively coupling the first cascode with a source follower transistor in feedback and operatively coupling the second cascode with a source follower transistor in feedback.

9. A system comprising:
   an optical interconnect; and
   at least one amplifier circuit operatively coupled to the optical interconnect and comprising:
     a first differential pair transistor and a first cascode transistor arranged as a first cascode; and
     a second differential pair transistor and a second cascode transistor arranged as a second cascode;
     wherein the first and second cascodes are arranged as a differential pair;
     wherein the first cascode transistor is cross-coupled to the second cascode transistor; and
     wherein the at least one amplifier circuit further comprises a first source follower transistor operatively coupled to the first cascode and a second source follower transistor operatively coupled to the second cascode.

10. The system of claim 9, wherein the at least one amplifier circuit is a CMOS amplifier.

11. The system of claim 9, wherein the cascode transistors are NMOS transistors.

12. The system of claim 9, wherein the at least one amplifier circuit is configured as a trans-impedance amplifier (TIA).

13. The system of claim 12, wherein the at least one amplifier circuit further comprises additional capacitance operatively coupled to nodes shared by drains of the differential pair transistors and sources of the cascode transistors.

14. The system of claim 9, wherein the at least one amplifier circuit further comprises additional capacitance operatively coupled to nodes shared by drains of the differential pair transistors and sources of the cascode transistors.

15. The system of claim 9, wherein the at least one amplifier circuit is configured as a stand-alone voltage amplifier.

16. A device comprising:
   a plurality of amplifier circuits operatively coupled to one other, each amplifier circuit comprising:
      a first differential pair transistor and a first cascode transistor arranged as a first cascode; and
      a second differential pair transistor and a second cascode transistor arranged as a second cascode;
      wherein the first and second cascodes are arranged as a differential pair;
      wherein the first cascode transistor is cross-coupled to the second cascode transistor; and
      wherein at least one amplifier circuit further comprises a first source follower transistor operatively coupled to the first cascode and a second source follower transistor operatively coupled to the second cascode.

17. The device of claim 16, wherein each amplifier circuit is configured as a CMOS amplifier circuit.

18. The device of claim 16, wherein the cascode transistors are NMOS transistors.

19. The device of claim 16, wherein the at least one amplifier circuit is configured as a trans-impedance amplifier (TIA).

20. The device of claim 19, wherein the at least one amplifier circuit further comprises additional capacitance operatively coupled to nodes shared by drains of the differential pair transistors and sources of the cascode transistors.

21. The device of claim 16, wherein at least one amplifier circuit further comprises additional capacitance operatively coupled to nodes shared by drains of the differential pair transistors and sources of the cascode transistors.

22. The device of claim 16, wherein at least one amplifier circuit is configured as a stand-alone voltage amplifier.

* * * * *